(12) United States Patent
Chan et al.

(10) Patent No.: US 9,275,710 B2
(45) Date of Patent: Mar. 1, 2016

(54) THREE DIMENSIONAL CROSS-ACCESS DUAL-PORT BIT CELL DESIGN

(71) Applicant: Taiwan Semiconductor Manufacturing Co., Ltd., Hsin-Chu (TW)

(72) Inventors: Wei Min Chan, Sindian (TW); Kao-Cheng Lin, Taipei (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 188 days.

(21) Appl. No.: 14/014,431

(22) Filed: Aug. 30, 2013

(65) Prior Publication Data

US 2015/0063040 A1  Mar. 5, 2015

(51) Int. Cl.
*G11C 8/16*  (2006.01)
*G11C 11/41*  (2006.01)
*G11C 8/14*  (2006.01)
*G11C 8/08*  (2006.01)
*G11C 11/412*  (2006.01)
*G11C 11/413*  (2006.01)
*G11C 11/417*  (2006.01)
*G11C 5/06*  (2006.01)

(52) U.S. Cl.
CPC .. *G11C 8/16* (2013.01); *G11C 8/08* (2013.01); *G11C 8/14* (2013.01); *G11C 11/41* (2013.01); *G11C 11/412* (2013.01); *G11C 11/413* (2013.01); *G11C 11/417* (2013.01); *G11C 5/06* (2013.01); *G11C 5/063* (2013.01)

(58) Field of Classification Search
CPC .......... G11C 11/419; G11C 8/16; G11C 8/08; G11C 11/417; G11C 11/41; G11C 11/412; G11C 8/14; G11C 11/413; G11C 5/06; G11C 5/063
See application file for complete search history.

(56) References Cited

U.S. PATENT DOCUMENTS

| | | | | | |
|---|---|---|---|---|---|
| 5,818,786 | A | * | 10/1998 | Yoneda | 365/230.03 |
| 5,826,056 | A | * | 10/1998 | Noda | 711/167 |
| 6,145,063 | A | * | 11/2000 | Ueno et al. | 711/157 |
| 2003/0198120 | A1 | * | 10/2003 | Nagano | 365/230.05 |
| 2006/0250880 | A1 | * | 11/2006 | Ramaraju et al. | 365/230.05 |
| 2008/0310220 | A1 | * | 12/2008 | Tan et al. | 365/182 |

* cited by examiner

*Primary Examiner* — J. H. Hur
(74) *Attorney, Agent, or Firm* — Duane Morris LLP

(57) ABSTRACT

A semiconductor memory comprises a dual-port memory array having a plurality of cross-access dual-port bit cells arranged in a plurality of rows and a plurality of columns, wherein each of the plurality of cross-access dual-port bit cells has two cross-access ports for read and write of one or more bits of data to the cross-access dual port bit cell. The semiconductor memory further comprises a pair of word lines associated with at least one of the plurality of rows of the dual-port memory array, wherein the pair of word lines is configured to carry a pair of row selection signals for enabling one or more read and write operations on one or more cross-access dual-port bit cells in the row. The semiconductor memory further comprises a pair of column selection lines associated with at least one of the plurality of columns of the dual port memory array, wherein the pair of column selection lines is configured to carry a pair of column selection signals for enabling the cross-access dual-port bit cells in the column during the read and write operations.

19 Claims, 9 Drawing Sheets

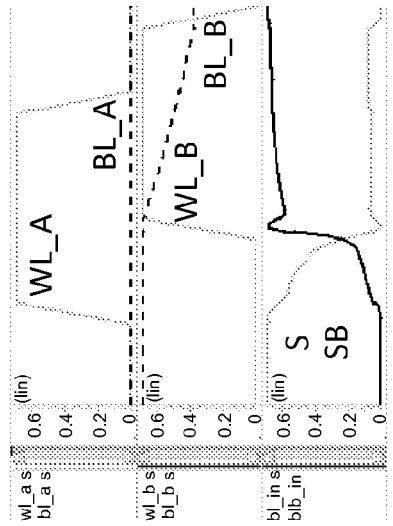
FIG. 3B
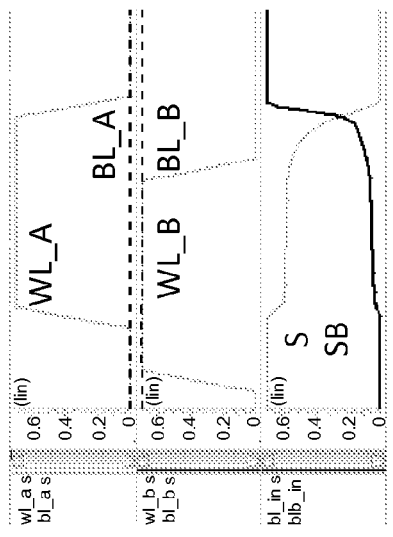
FIG. 3A
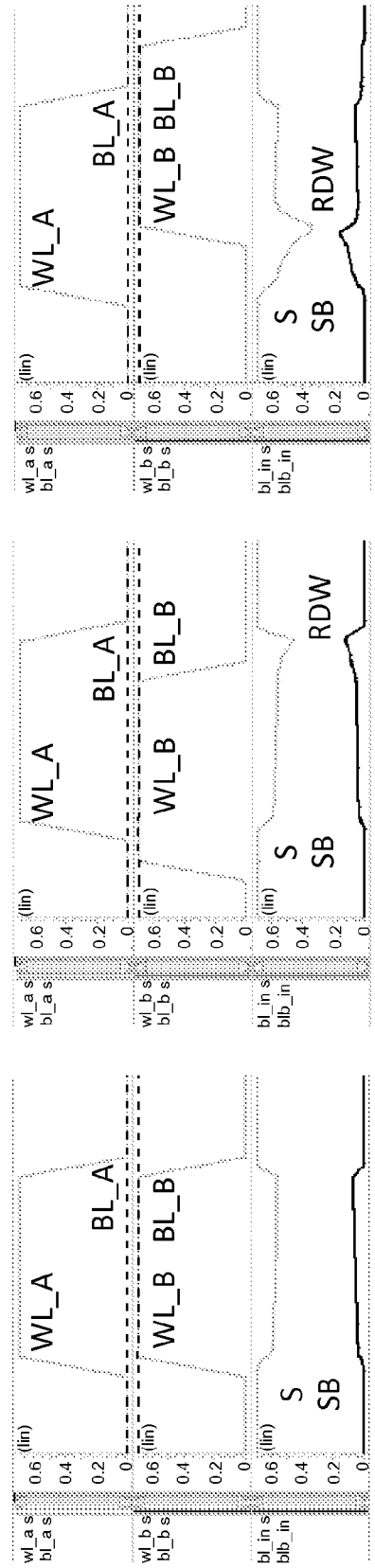
FIG. 3E
FIG. 3D
FIG. 3C

THREE DIMENSIONAL CROSS-ACCESS DUAL-PORT BIT CELL DESIGN

FIELD OF DISCLOSURE

The disclosed systems and methods relate to semiconductor memories. More particularly, the disclosed systems and methods relate to dual-port semiconductor memories.

BACKGROUND

Static random access memories ("SRAM") include a plurality of bit cells disposed in rows and columns to form an array. Each SRAM bit cell includes a plurality of transistors coupled to bit lines and word lines that are used to read one or more bits of data from and write one or more bits of data to the bit cell. SRAMs have the advantageous feature of holding data without requiring a refresh and are commonly used in integrated circuits. Embedded SRAM is particularly popular in high speed communication, image processing and system on chip (SOC) applications.

Dual port SRAM bit cell is a specific type of SRAM bit cell having two ports (e.g., port A and port B) that enable multiple reads or writes of the bits of data stored in the SRAM bit cell to occur via port A and port B at approximately the same time. Such dual-port bit cell design allows for parallel operations to be performed on the bit cell by different applications. Moreover, if a first SRAM cell and a second SRAM cell are in a same column or a same row, a read operation to the first SRAM cell can also be performed simultaneously with a write operation on the second SRAM cell.

BRIEF DESCRIPTION OF THE DRAWINGS

FIGS. 3A-3E illustrate timing sequence of port selection signals for dual port bit cells on the same row of a dual port memory in accordance with some embodiments.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

The inventors have discovered a novel dual port bit cell memory chip design having a plurality of dual port bit cells in a dual port memory in which each of the dual port bit cells has a pair of cross access read/write ports, port A and port B, for read and write operations to the bit cell. In some embodiments, the pair of cross access read/write ports are controlled by row and column selection signals. A three dimensional SRAM structure is disclosed in which each of the cross access dual port bit cells is split by implementing a pair of cross access read/write ports on a separate layer from the rest of the components of the dual port bit cells. In some embodiments, during operation, only one of the ports of each of the cross access dual port bit cells is enabled when multiple bit cells on the same row of the dual port memory are selected for a read and/or a write operation.

Figure 1A:
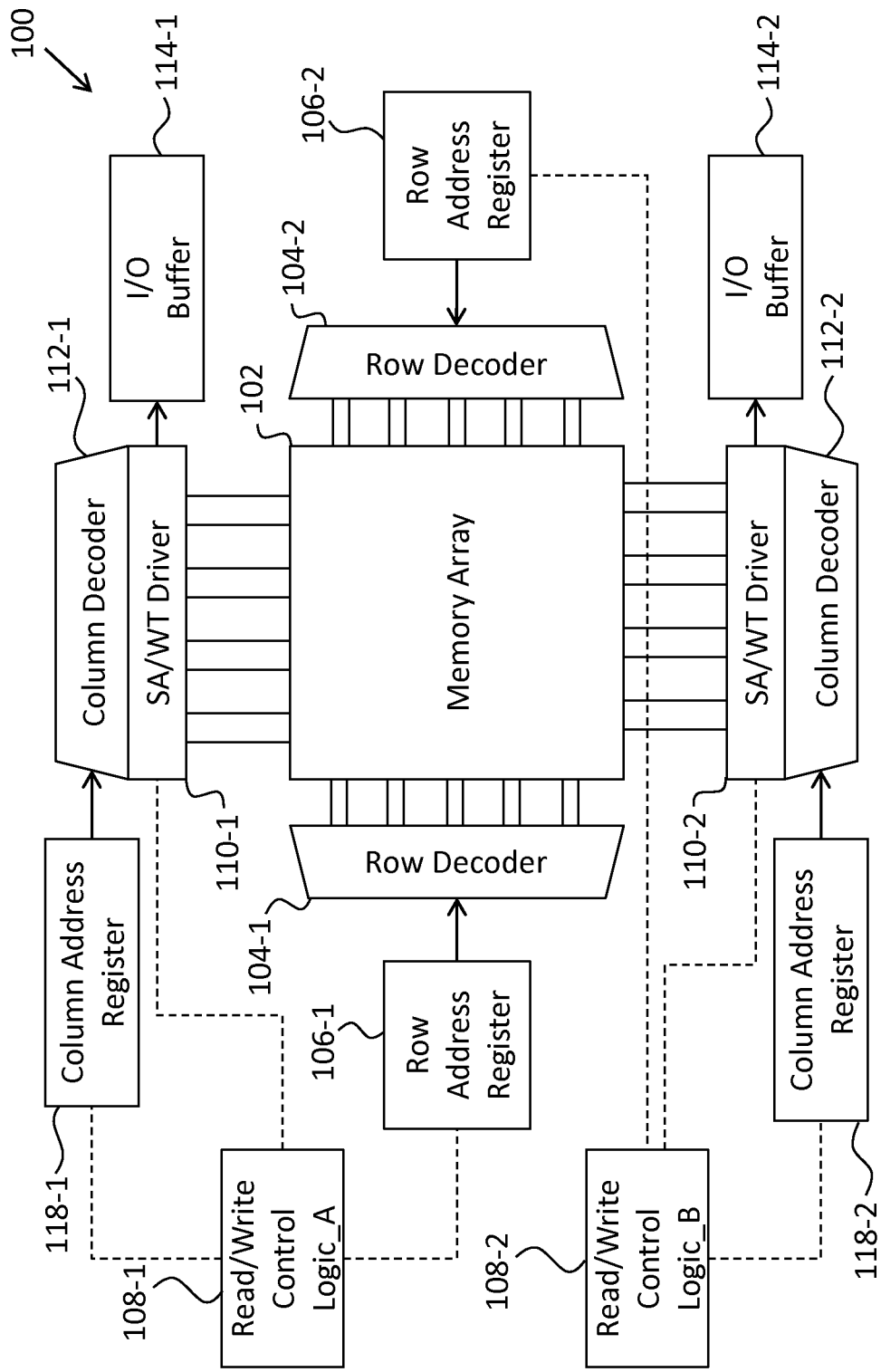
FIG. 1A is a block diagram of one example of a dual port memory in accordance with some embodiments.
Figure 1B:
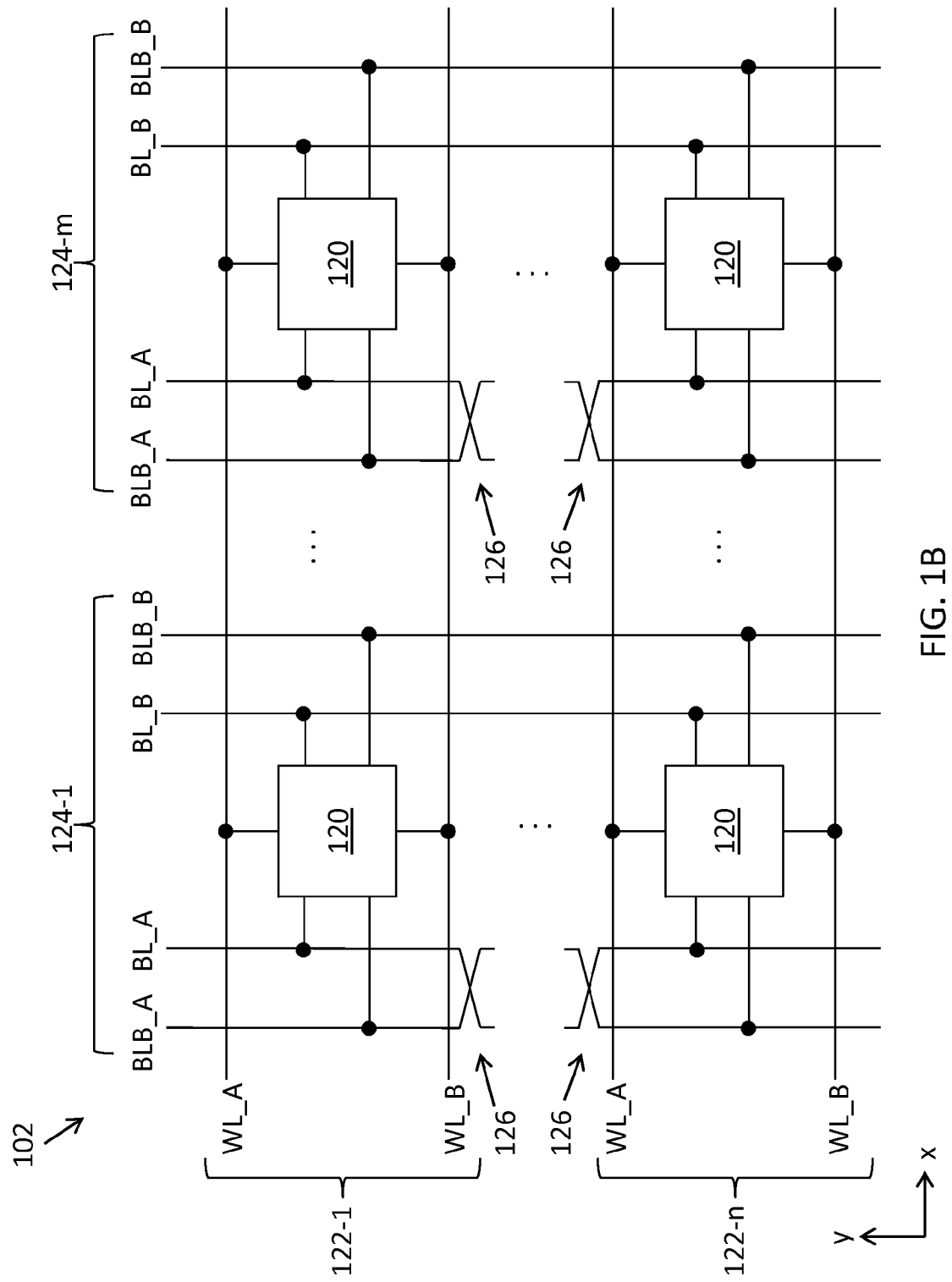
FIG. 1B is a block diagram of one example of a memory array in accordance with the dual port memory illustrated in FIG. 1A.

FIG. 1A illustrates one example of a dual port memory 100, which includes an array 102 of memory bit cells 120 (see FIG. 1B). Array 102 is coupled to row decoders 104-1, 104-2 (collectively "row decoders 104"), which receive row addresses from row address registers 106-1, 106-2 (collectively "row address registers 106"), respectively. Row address registers 106 are coupled to respective read/write control logic 108-1, 108-2 (collectively "read/write control logic 108").

Memory array 102 is also coupled to a sense amplifiers ("SA")/write driver blocks 110-1, 110-2 (collectively "SA/write driver blocks 110"), which are coupled to respective column decoders 112-1, 112-2 (collectively column decoders 112") and input/output buffers 114-1, 114-2 (I/O buffers 114"). Column decoders 112 are each coupled to a respective column address register 118-1, 118-2 (collectively "column address registers 118") that receives an address from read/write control logic 108.

Turning now to FIG. 1B, which illustrates one example of a dual port memory array 102 in accordance with some embodiments, bit cells 120 are arranged in a number, n, of rows 122 and a number, m, of columns 124. Each bit cell 120 is disposed between a pair of word lines, WL_A and WL_B, for read/write operations via port A and port B, respectively, that extend horizontally across the memory array (i.e., in an x-direction). Two pairs of complementary bit lines ("BL"), BL_A and BLB_A, BL_B and BLB_B, for read/write bits of data from port A and port B, respectively, extend vertically across the memory array (i.e., in a y-direction). In some embodiments, bit lines BLB_A and BL_A may include twists 126, which are used to mitigate coupling issues between bit lines BL_A and BL_B or balance loading of BL_A and BLB_A.

Figure 1C:
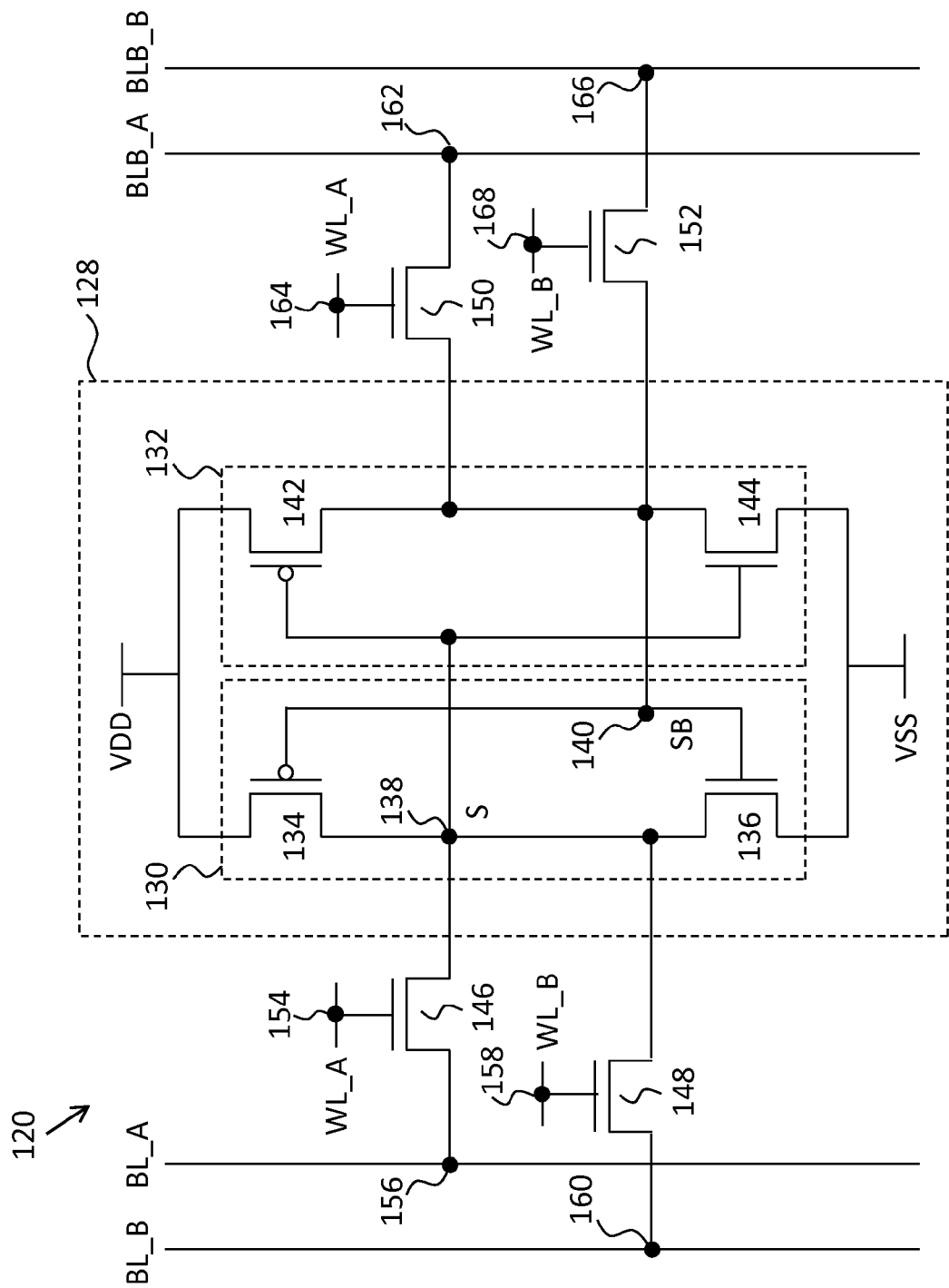
FIG. 1C illustrates one example of a dual port bit cell in accordance with the memory array illustrated in FIG. 1B.

One example of an eight transistor ("8T") bit cell 120 is illustrated in FIG. 1C. Although an 8T bit cell is described as an example of the bit cell hereinafter, one of ordinary skill in the art will understand that bit cells can be formed using other numbers of transistors including, but not limited to, 6T, 10T, 12T, and 14T, to name only a few possibilities.

As shown in FIG. 1C, bit cell 120 includes a latch 128 formed by a pair of cross-coupled inverters 130, 132 for storing a bit of data. Inverter 130 includes a PMOS transistor 134, which functions as a pull-up transistor, and an NMOS transistor 136, which functions as a pull-down transistor. PMOS transistor has its source coupled to high-voltage source, VDD, and its drain coupled to node 138 that serves as the output of inverter 130. NMOS transistor 136 of inverter 130 has its source coupled to low-voltage source VSS and its drain coupled to S node 138. The gates of transistors 134 and 136 are coupled together at SB node 140, which serves as the input of inverter 130 and the output of inverter 132.

As shown in FIG. 1C, inverter 132 includes a PMOS transistor 142, which serves as a pull-up transistor in some embodiments, and an NMOS transistor 144, which serves as a pull-down transistor in some embodiments. Transistor 142 has its source coupled to VCC, its gate coupled to S node 138, and its drain coupled to SB node 140. Transistor 144 of inverter 132 has its source coupled to VSS, its drain coupled to SB node 140, and its gate coupled to S node 138.

As shown in FIG. 1C, bit cell 120 also includes a plurality of pass transistors 146, 148, 150, and 152. In some embodiments, transistors 146, 148, 150, and 152 are NMOS transistors, although one skilled in the art will understand that transistors 146, 148, 150, and 152 may be implemented as PMOS transistors. Transistor 146 has its gate coupled to word line WL_A at node 154, its source coupled to S node 138, and its drain coupled to bit line BL_A at node 156. Transistor 148 has its gate coupled to word line WL_B at node 158, its source coupled to S node 138, and its drain coupled to bit line BL_B at node 160. Transistor 150 has its source coupled to SB node 140, its drain coupled to bit line BLB_A at node 162, and its gate coupled to word line WL_A at node 164. Transistor 152 has its source coupled to SB node 140, its drain coupled to bit line BLB_B at node 166, and its gate coupled to word line WL_B at node 168.

Figure 2:
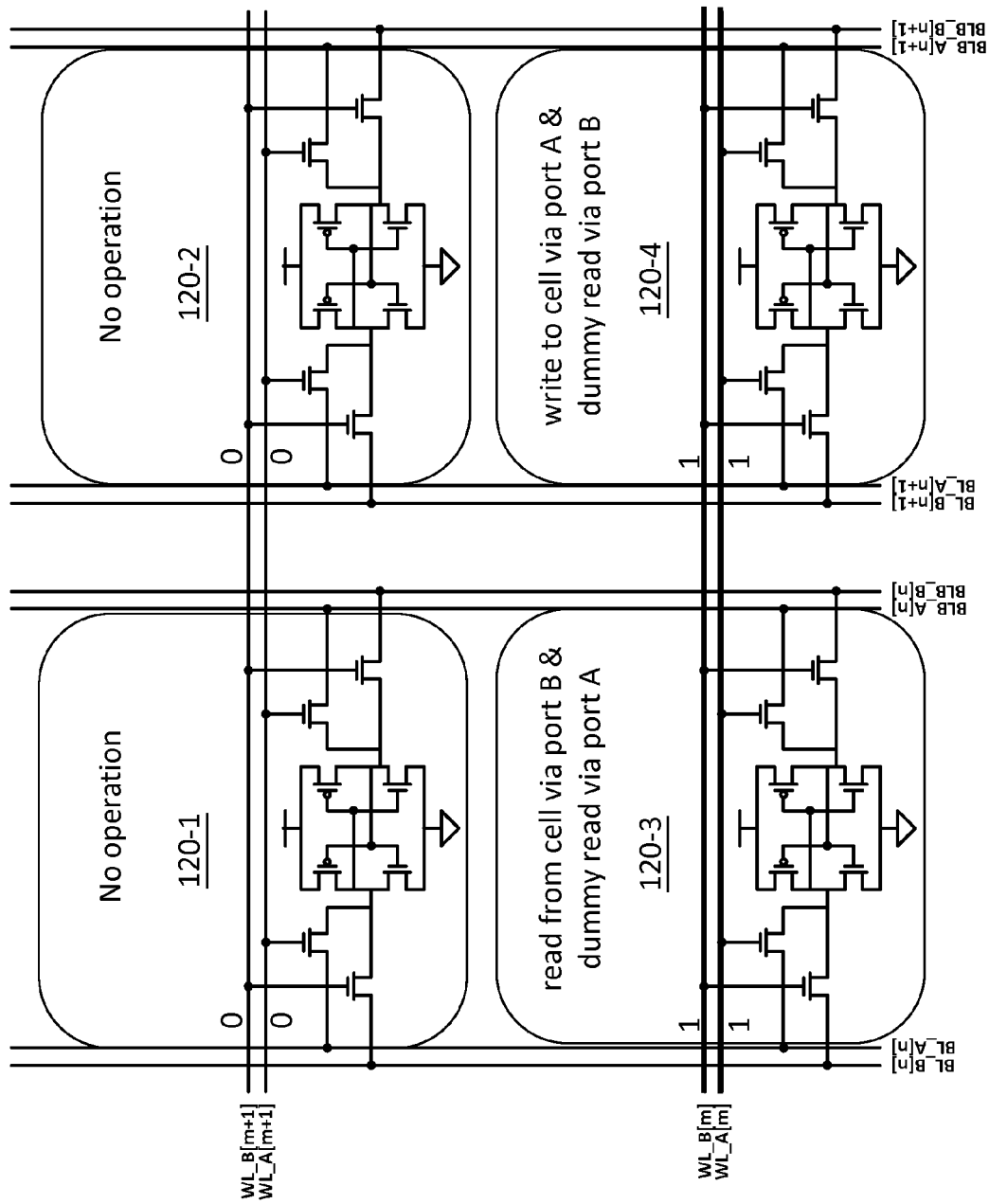
FIG. 2 depicts an example of performing read and write operations on accessing dual port bit cells in the dual port memory with only row selection signals in accordance with some embodiments.

In some embodiments, during the operation of the dual port memory 100, no read/write operation is performed on bit cells 120-1 and 120-2 if their corresponding WL_A and WL_B signals are disabled (e.g., at logic level "0") as shown in FIG. 2. For example, in some embodiments, both WL_A and WL_B are enabled (e.g., at logic level "1") at the same time to access bit cells 120-3 and 120-4 on the same row of SRAM via port A and port B, respectively.

In the example shown in FIG. 2, WL_A is enabled to perform a write operation on bit cell 120-4 via port A, and WL_B is enabled to perform a read operation on bit cell 120-3 on the same row via port B simultaneously. With both WL_A and WL_B enabled, a dummy read operation is performed via port A of bit cell 120-3 while the read operation is performed via port B. At the same time, a dummy read operation is performed via port B of bit cell 120-4 while the write operation to the cell is performed via port A. Since the read operation is being performed on bit cell 120-3 via port B, where both bit cells 120-3 and 120-4 share the same enabled word line, i.e., WL_B line, the dummy read operation via port B of bit cell 120-4 is not disabled, which may lead to Read-Disturb-Write (RDW) issue.

Specifically, as shown by the signal diagrams of FIGS. 3A and 3B, respectively, both WL_A and WL_B can be enabled to perform a write operation via port A and a dummy read operation via port B to bit cell 120-4. The write operation via port A can be performed successfully if WL_A pulse is ahead or behind of WL_B pulse in time by a sufficient margin for the write operation to proceed. If, on the other hand, the WL_A pulse and the WL_B pulse fully overlap with each other in time as shown in FIG. 3C, the write operation to bit cell 120-4 will fail. Even when the WL_A pulse and the WL_B pulse do not fully overlap, the write operation to bit cell 120-4 will fail if there is not sufficient margin in time between the pulses (either ahead or behind) for the write operation to proceed as shown in FIGS. 3D and 3E. Such write failure due to a simultaneous read operation is referred to as the RDW issue. The RDW issue would result in increase in write Vccmin of dual port bit cells 120 necessary to complete the write operation, which also leads to increase in overall Vccmin of dual port memory 100.

Figure 4:
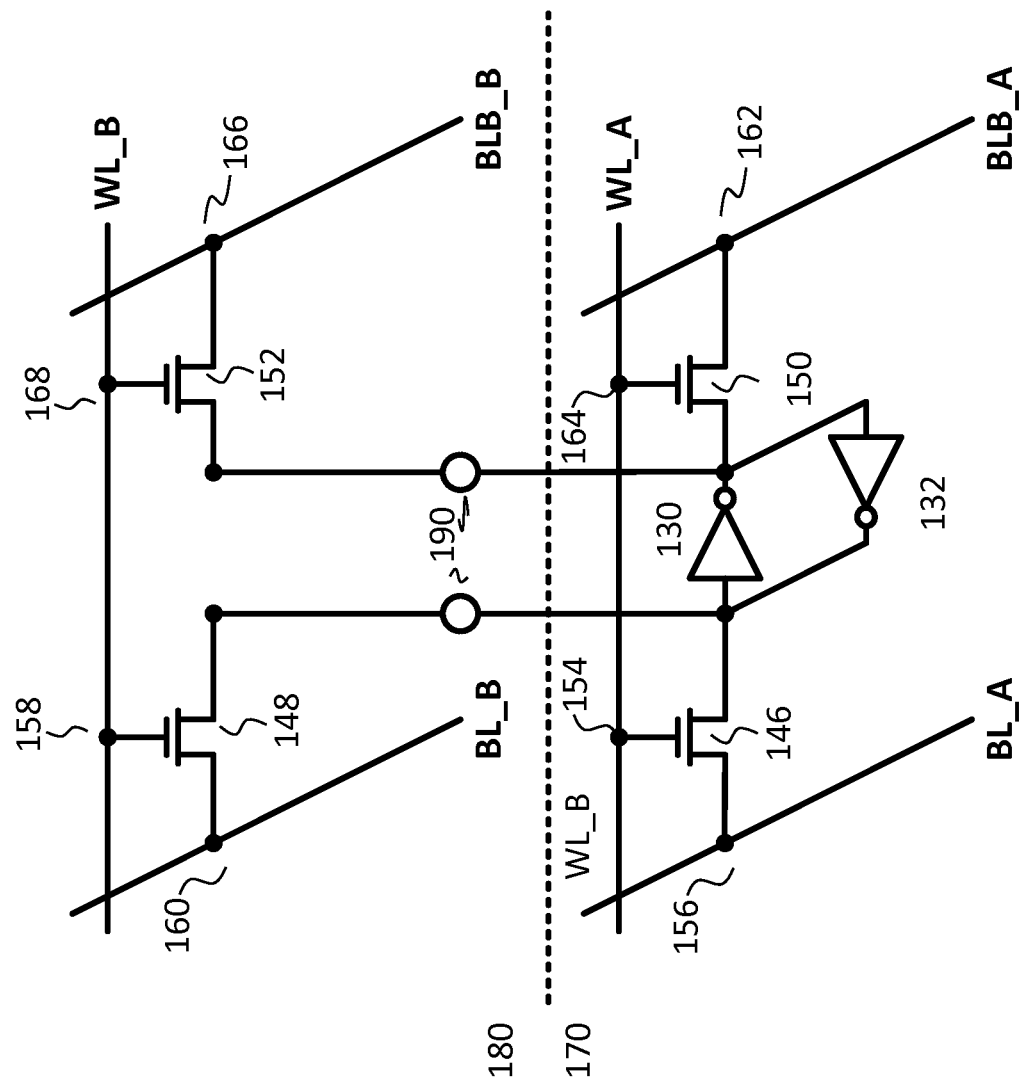
FIG. 4 depicts an example of a schematic view of a 3D structure for dual port bit cell 120 where word lines and bit lines of port A and port B of the bit cell are implemented on two different layers, respectively, in accordance with some embodiments.

In some embodiments, each dual port bit cell 120 is implemented in a three dimensional (3D) SRAM structure with its various components being manufactured on different layers wherein the components on different layers are connected with each other via one or more inter-layer vias (ILVs). By utilizing multiple layers to fabricate the dual port bit cell 120, such 3D SRAM architecture reduces the chip size or footprint of dual port memory 100. FIG. 4 depicts an example of a schematic view of a 3D structure for dual port bit cell 120 where word lines and bit lines of port A and port B of the bit cell are implemented on two different layers 170 and 180, respectively, and the components of port A and port B are connected to each other via ILVs 190. Although such 3D structure helps to reduce the footprint of dual port bit cell 120, it has little to no impact on alleviating the RDW issue caused by simultaneous read/write operation to a dual port bit cell as discussed above.

Figure 5:
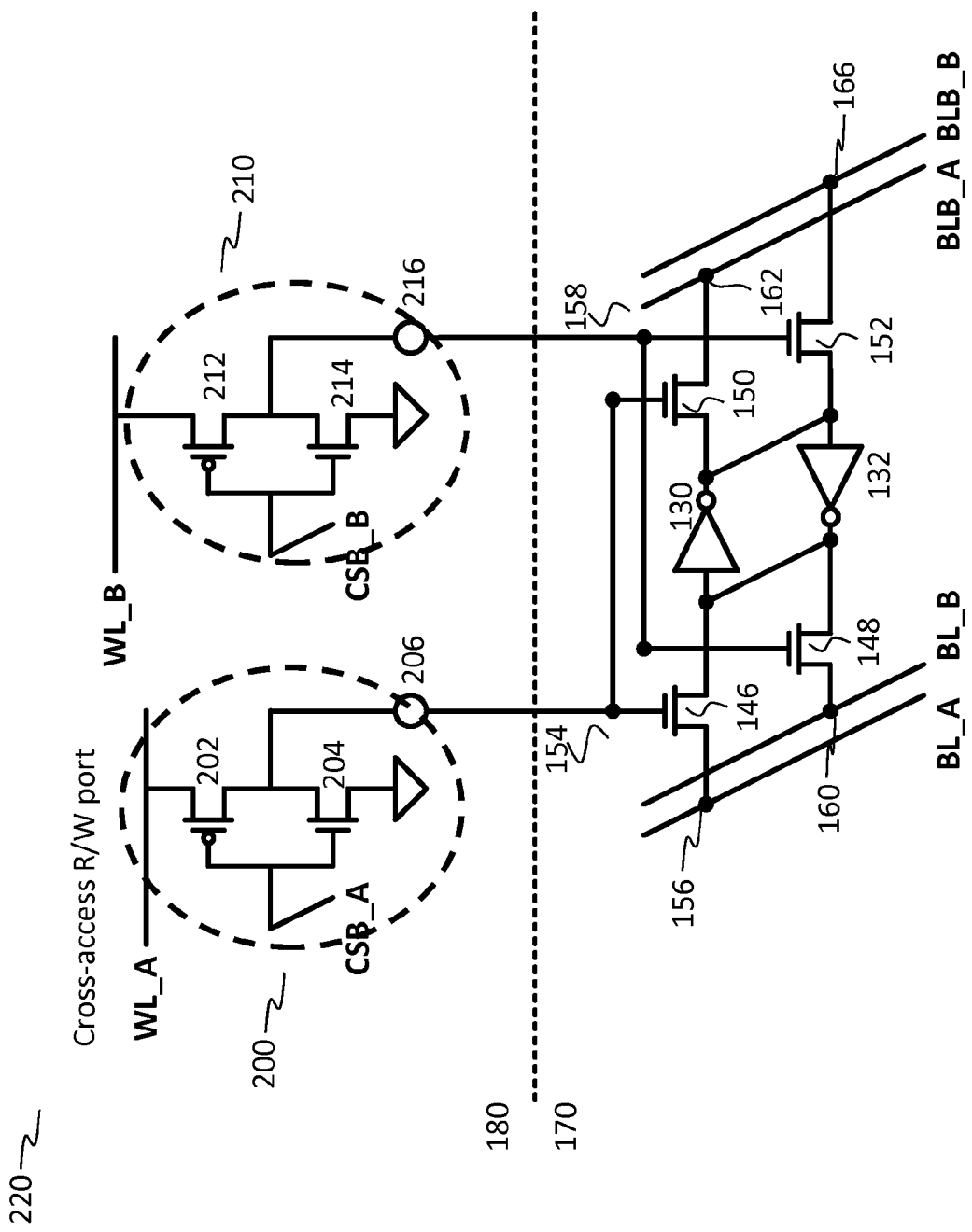
FIG. 5 depicts an example of a schematic view of a 3D structure for dual port bit cell 220, which in addition to dual port bit cell 120, further includes cross-access read/write (R/W) ports to control read/write operations to the dual port bit cell in accordance with some embodiments.

FIG. 5 depicts an example of a schematic view of a 3D structure for dual port bit cell 220, which in addition to dual port bit cell 120 includes cross-access read/write (R/W) ports to control read/write operations to the dual port bit cell. As shown in FIG. 5, cross-access R/W port 200 includes a PMOS transistor 202, which functions as a pull-up transistor, and an NMOS transistor 204, which functions as a pull-down transistor. Transistor 202 has its source coupled to WL_A, and its drain coupled to node/inter-layer via 206 that serves as the output of cross-access R/W port 200. Transistor 204 of output of cross-access R/W port 200 has its source coupled to low-voltage source VSS, and its drain coupled to node 206. The gates of transistors 202 and 204 are coupled together and controlled by column-select signal CSB_A.

Similarly, cross-access R/W port 210 includes a PMOS transistor 212, which functions a pull-up transistor, and an NMOS transistor 214, which functions as a pull-down transistor. Transistor 212 has its source coupled to WL_B, and its drain coupled to node/inter-layer via 216 that serves as the output of cross-access R/W port 210. Transistor 214 of output of cross-access R/W port 210 has its source coupled to low-voltage source VSS, and its drain coupled to node 216. The gates of transistors 212 and 214 are coupled together and controlled by column-select signal CSB_B.

In some embodiments, cross-access R/W port 200 and 210 are manufactured on layer 180, which is separate from layer 170 on which the rest of the components of dual port bit cell 220 are manufactured. For example, the components of dual port bit cell 220 on the two separate layers are connected with each other via at least inter-layer vias 206 and 216 to form a 3D SRAM structure for dual port bit cell 220. Such a 3D SRAM structure reduces the footprint of dual port bit cell 220 and simplifies the routing between the cross-access R/W ports and the rest of the dual port bit cell by putting the cross-access R/W ports on separate layers.

During the operation of a dual port memory comprising cross-access dual port bit cells 220, both row-select signals WL_A and WL_B, which are positive enabled to select an address of a row of the bit cell to be accessed. Both column-select signals CSB_A and CSB_B are negative enabled to select an address of a column of the bit cell to be accessed. Both WL_A/WL_B and CSB_A/CSB_B are utilized to enable a cross-access operation on the dual port bit cells 220.

Figure 6:
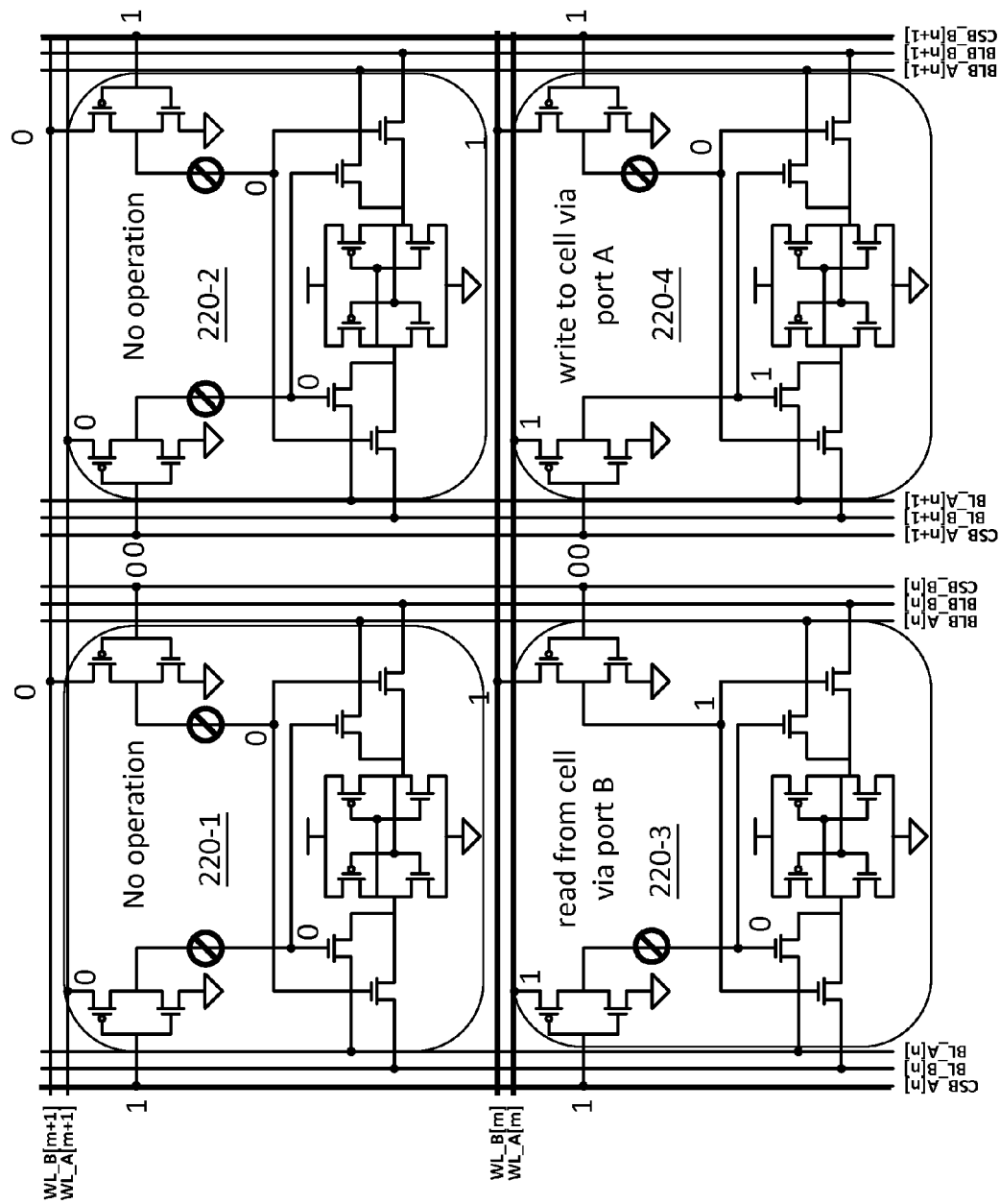
FIG. 6 depicts an example of performing read and write operations on cross access dual port bit cells in the dual port memory with cross access by both row and column selection signals in accordance with some embodiments.

For example, as shown in FIG. 6, read/write operation are not performed on bit cells 220-1 and 220-2 when their corresponding cross-access R/W ports are turned off due to their WL_A and WL_B signals being disabled (e.g., at logic level "0"), regardless of the voltage or logic levels of their column-select signals CSB_A and CSB_B. When both WL_A and WL_B are enabled (e.g., at logic level "1") at the same time to perform read and write operations on bit cells 220-3 and 220-4 on the same row of SRAM via port A and port B, respectively, column-select signals CSB_A and CSB_B select the bit cell on which a read or write operation is to be performed.

For example, as shown in FIG. 6, WL_A is enabled to perform a write operation on bit cell 220-4 via port A, and WL_B is enabled simultaneously to perform a read operation on bit cell 220-3 on the same row via port B. Since CSB_B[n] is set to a logic "0" (i.e., negatively-enabled) to choose port B of bit cell 220-3 while CSB_A[n] is set to logic "1" (i.e., negatively-disabled) to block port A of bit cell 220-3, a read operation is performed on bit cell 220-3 via port B without a dummy read being performed via port A of bit cell 220-3. At the same time, since CSB_A[n+1] is set to a logic "0" (i.e., negatively-enabled) to select port A of bit cell 220-4 while CSB_B[n+1] is set to logic "1" (i.e., negatively-disabled) to block port B of bit cell 220-4, a write operation is performed on bit cell 220-4 via port A without a dummy read operation being performed via port B of bit cell 220-4. Since the write operation is performed on bit cell 220-4 without the disturbance from a competing read operation via port B of the same bit cell, the Read-Disturb-Write (RDW) issue is eliminated by the cross-access dual port bit cells 220.

Figure 7:
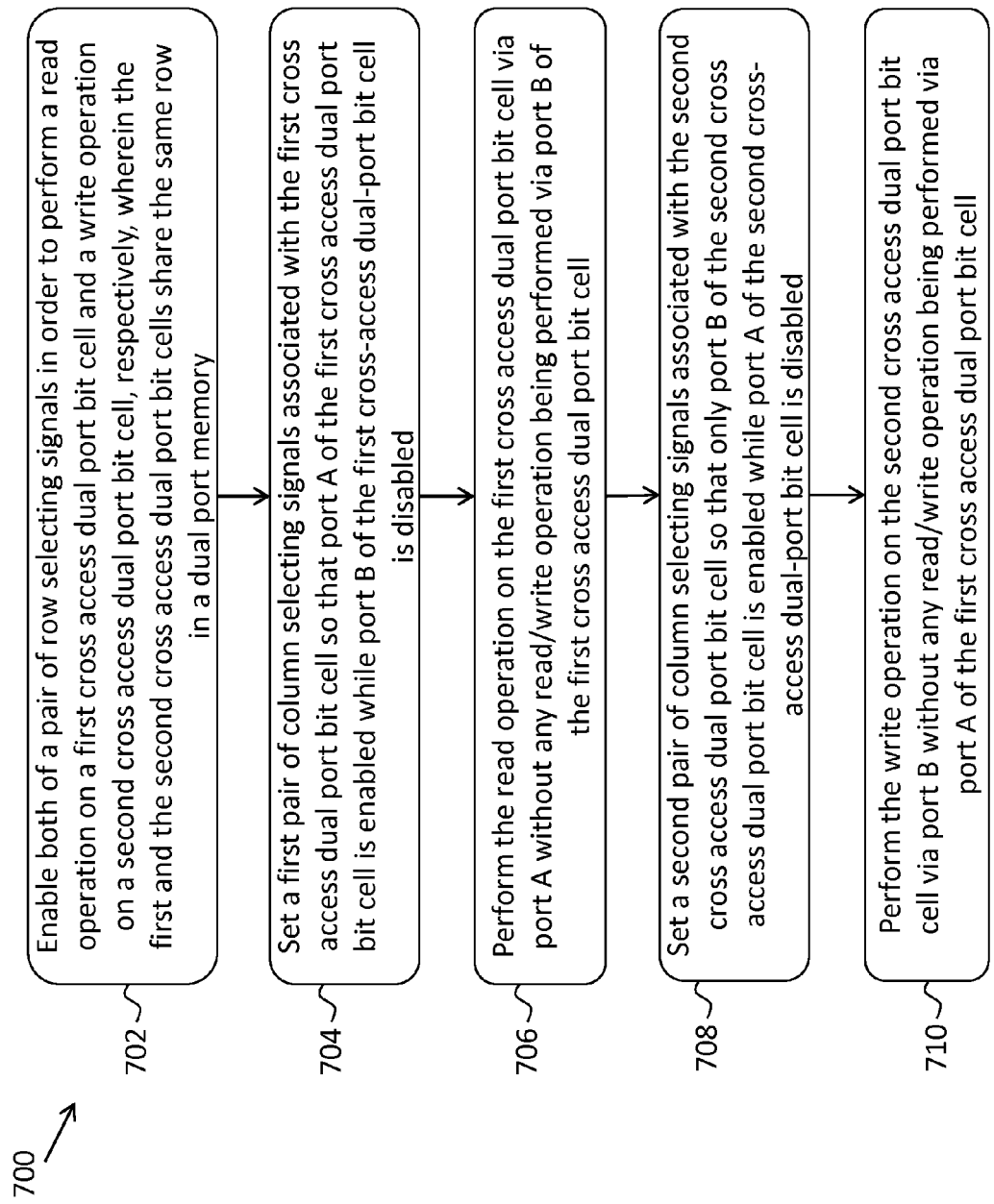
FIG. 7 is one example of a flow chart of a method for performing simultaneous read and write operations on at least two cross access dual port bit cells, respectively, wherein the two cross-access dual port bit cells are in the same row in a dual port memory chip in accordance with some embodiments.

FIG. 7 is one example of a flow chart 700 of a method for performing simultaneous read and write operations on at least two cross access dual port bit cells, respectively, wherein the two cross-access dual port bit cells are in the same row in a dual port memory chip.

At step 702, a pair of row selecting signals is both enabled to perform a read operation on a first cross-access dual-port bit cell and a write operation on a second cross-access dual port bit cell, respectively. In some embodiments, the first and the second cross-access dual-port bit cells share the same row in a dual-port memory.

At step 704, a first pair of column selecting signals associated with the first cross-access dual port bit cell is set so that port A of the first cross-access dual-port bit cell is enabled while port B of the first cross-access dual-port bit cell is disabled.

At step 706, the read operation is performed on the first cross-access dual port bit cell via port A without any read/write operation being performed via port B of the first cross-access dual-port bit cell.

At step 708, a second pair of column selecting signals associated with the second cross-access dual-port bit cell is set so that port B of the second cross-access dual-port bit cell is enabled while port A of the second cross-access dual-port bit cell is disabled.

At step 710, the write operation is performed on the second cross-access dual-port bit cell via port B without a read/write operation being performed via port A of the first cross-access dual-port bit cell.

With the dual port bit cell memory chip design described above, the read-disturb-write (RDW) issue, which may happen when a write operation to a dual port bit cell is disturbed by a read or dummy read operation to the same dual port bit cell via a different port, can be avoided and the write voltage to the bit cell can therefore be improved to satisfy a low VDD operation.

In some embodiments, a semiconductor memory comprises a dual-port memory array having a plurality of cross-access dual-port bit cells arranged in a plurality of rows and a plurality of columns, wherein each of the plurality of cross-access dual-port bit cells has two cross-access ports for read and write of one or more bits of data to the cross-access dual port bit cell. The semiconductor memory further comprises a pair of word lines associated with at least one of the plurality of rows of the dual-port memory array, wherein the pair of word lines is configured to carry a pair of row selection signals for enabling one or more read and write operations on one or more cross-access dual-port bit cells in the row. The semiconductor memory further comprises a pair of column selection lines associated with at least one of the plurality of columns of the dual port memory array, wherein the pair of column selection lines is configured to carry a pair of column selection signals for enabling the cross-access dual-port bit cells in the column during the read and write operations.

In some embodiments, the semiconductor memory further comprises a pair of bit lines coupled to the two cross-access ports of the plurality of cross-access dual-port bit cells for read/write of the one or more bits of data from the cross-access dual-port bit cell.

In some embodiments, each of the cross-access ports of the cross-access dual-port bit cell includes a pair of transistors.

In some embodiments, the cross-access ports of the cross-access dual-port bit cell are disposed on a layer that is separate from the layers on which the rest of the cross-access dual-port bit cell is disposed.

In some embodiments, the cross-access ports are coupled to other components of the cross access dual port bit cell formed on a different layer via one or more inter-layer vias to form a three-dimensional (3D) structure.

In some embodiments, the cross-access ports of the cross-access dual-port bit cell are coupled to the pair of word lines associated with the row of the cross access dual port bit cell.

In some embodiments, the cross-access ports of the cross-access dual-port bit cell are controlled by the pair of column-selection lines associated with the column of the cross-access dual-port bit cell.

In some embodiments, each of the pair of row selection signals is enabled to select one of the cross-access ports of the cross-access dual-port bit cells in the row when the row selection signal is logically high.

In some embodiments, each of the pair of column selection signals is enabled to select one of the cross-access ports of the cross-access dual port bit cells in the column when the column selection signal is logically low, wherein one of the pair of column-selection signals is logically low at any time during the read and write operations.

In some embodiments, a semiconductor memory cell comprises a latch for storing one or more bits of data in the memory cell and a pair of cross access ports for read and write the one or more bits of data to the memory cell. The pair of cross access ports is coupled to a pair of word lines configured to carry a pair of row selection signals for a row of the memory cell in a memory array, and wherein the pair of cross access ports is controlled by a pair of column selection lines configured to carry a pair of column control signals for a column of the memory cell in the memory array during a read or write operation to the memory cell.

In some embodiments, the pair of cross access ports is formed on a layer separate from the other components of the memory cell formed on a different layer.

In some embodiments, the pair of cross access ports is connected to the other components of the memory cell formed on the different layer via one or more inter-layer vias to form a three dimensional (3D) structure.

In some embodiments, each of the pair of row selection signals is positive enabled to select one of the cross access ports of the memory cell in the row when the row selection signal is logically high.

In some embodiments, each of the pair of column selection signals is negative enabled to select one of the cross access ports of the memory cell in the column when the column selection signal is logically low, wherein one of the pair of column selection signals is logically low at any time during the read or write operation.

In some embodiments, a method performed with a dual port memory array having a plurality of cross access dual port bit cells arranged in a plurality of row and a plurality of columns comprises enabling a pair of row selecting signals to perform one or more read and write operations on one or more cross access dual port bit cells in a row of the dual port memory array, wherein each of the plurality of cross access dual port bit cells has two cross access ports for the read or write operations to the cross access dual port bit cell. The method further comprises setting a first pair of column selecting signals associated with a first cross access dual port bit cell so that one of the cross access ports of the first cross access dual port bit cell is enabled and performing a write operation to the first cross access dual port bit cell via the enabled cross access port without any read/write operation being performed via the other cross access port of the first cross access dual port bit cell.

In some embodiments, the method further comprises setting a second pair of column selecting signals associated with a second cross access dual port bit cell so that one of the cross access ports of the second cross access dual port bit cell is enabled and performing a read or write operation on the second cross access dual port bit cell via the enabled cross access port without any read/write operation being performed via the other cross access port of the second cross access dual port bit cell, wherein the first and the second cross access dual port bit cells share the same row in the dual port memory array.

In some embodiments, the method further comprises forming the cross access ports of each of the plurality of cross access dual port bit cells on a layer separate from other components of the cross access dual port bit cell formed on a different layer.

In some embodiments, the method further comprises connecting the pair of cross access ports to the other components of the cross access dual port bit cell formed on the different layer via one or more inter-layer vias to form a three dimensional (3D) structure.

In some embodiments, each of the pair of row selection signals is positive enabled to select one of the cross access ports of the cross access dual port bit cells in the row when the row selection signal is logically high.

In some embodiments, each of the pair of column selection signals is negative enabled to select one of the cross access ports of the cross access dual port bit cells in the column when the column selection signal is logically low, wherein one of the pair of column selection signals is logically low at any time during the write operation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
   a dual-port memory array having a plurality of cross-access dual-port bit cells arranged in a plurality of rows and a plurality of columns, wherein each of the plurality of cross-access dual-port bit cells has two cross-access ports for reading and writing one or more bits of data to the cross-access dual port bit cell;
   a pair of word lines associated with at least one of the plurality of rows of the dual-port memory array, wherein the pair of word lines is configured to carry a pair of row selection signals for enabling one or more read and write operations on one or more cross-access dual-port bit cells in the row;
   a pair of column selection lines associated with at least one of the plurality of columns of the dual port memory array, wherein the pair of column selection lines is configured to carry a pair of column selection signals for enabling the cross-access dual-port bit cells in the column during the read and write operations;
   a PMOS transistor and an NMOS transistor for each of the cross-access ports of the cross-access dual-port bit cell, wherein the PMOS transistor is configured to have its source coupled to one of the word lines and its drain coupled to an output node of the cross-access port, wherein the NMOS transistor is configured to have its source coupled to a low-voltage source and its drain coupled to the output node, wherein gates of the transistors are configured to be coupled together and controlled by one of the column selection lines so that only one of the cross-access ports of the cross-access dual-port bit cell is enabled during a read and/or a write operation.

2. The semiconductor memory of claim 1, further comprising:
   a pair of bit lines coupled to the two cross-access ports of the plurality of cross-access dual-port bit cells for reading/writing the one or more bits of data from the cross-access dual-port bit cell.

3. The semiconductor memory of claim 1, wherein:
   the cross-access ports of the cross-access dual-port bit cell are disposed on a layer that is separate from the layers on which the rest of the cross-access dual-port bit cell is disposed.

4. The semiconductor memory of claim 3, wherein:
   the cross-access ports are coupled to other components of the cross access dual port bit cell formed on a different layer via one or more inter-layer vias to form a three-dimensional (3D) structure.

5. The semiconductor memory of claim 1, wherein:
   the cross-access ports of the cross-access dual-port bit cell are coupled to the pair of word lines associated with the row of the cross access dual port bit cell.

6. The semiconductor memory of claim 1, wherein:
the cross-access ports of the cross-access dual-port bit cell are controlled by the pair of column-selection lines associated with the column of the cross-access dual-port bit cell.

7. The semiconductor memory of claim 1, wherein:
each of the pair of row selection signals is enabled to select one of the cross-access ports of the cross-access dual-port bit cells in the row when the row selection signal is logically high.

8. The semiconductor memory of claim 1, wherein:
each of the pair of column selection signals is enabled to select one of the cross-access ports of the cross-access dual port bit cells in the column when the column selection signal is logically low, wherein one of the pair of column-selection signals is logically low at any time during the read and write operations.

9. A semiconductor memory cell, comprising:
a latch for storing one or more bits of data in the memory cell;
a pair of cross-access ports for reading and writing the one or more bits of data to the memory cell;
wherein each of the pair of cross access ports includes a PMOS transistor and an NMOS transistor, wherein the PMOS transistor is configured to have its drain coupled to an output node of the cross-access port and its source coupled to one of a pair of word lines configured to carry a pair of row selection signals for a row of the memory cell in a memory array, and wherein the NMOS transistor is configured to have its source coupled to a low-voltage source and its drain coupled to the output node, wherein gates of the transistors are configured to be coupled together and controlled by one of a pair of column selection lines configured to carry a pair of column control signals for a column of the memory cell in the memory array so that only one of the cross-access ports of the cell is enabled during a read or write operation to the memory cell.

10. The semiconductor memory cell of claim 9, wherein:
the pair of cross access ports is formed on a layer separate from the other components of the memory cell formed on a different layer.

11. The semiconductor memory cell of claim 10, wherein:
the pair of cross access ports is connected to the other components of the memory cell formed on the different layer via one or more inter-layer vias to form a three dimensional (3D) structure.

12. The semiconductor memory cell of claim 9, wherein:
each of the pair of row selection signals is positive enabled to select one of the cross access ports of the memory cell in the row when the row selection signal is logically high.

13. The semiconductor memory cell of claim 9, wherein:
each of the pair of column selection signals is negative enabled to select one of the cross access ports of the memory cell in the column when the column selection signal is logically low, wherein one of the pair of column selection signals is logically low at any time during the read or write operation.

14. A method performed with a dual port memory array having a plurality of cross access dual port bit cells arranged in a plurality of rows and a plurality of columns, comprising:
enabling a pair of row selecting signals to perform one or more read and/or write operations on one or more cross access dual port bit cells in a row of the dual port memory array, wherein each of the plurality of cross access dual port bit cells has two cross access ports for the read or write operations to the cross access dual port bit cell, wherein each of the cross-access ports has a PMOS transistor and an NMOS transistor, wherein the PMOS transistor is configured to have its source coupled to one of a pair of word lines and its drain coupled to an output node of the cross-access port, wherein the NMOS transistor is configured to have its source coupled to a low-voltage source and its drain coupled to the output node, wherein gates of the transistors are configured to be coupled together and controlled by one of a pair of column selecting signals;
setting the pair of column selecting signals associated with a first cross access dual port bit cell so that only one of the cross access ports of the first cross access dual port bit cell is enabled;
performing a write operation to the first cross access dual port bit cell via the enabled cross access port without any read/write operation being performed via the other cross access port of the first cross access dual port bit cell.

15. The method of claim 14, further comprising:
setting a second pair of column selecting signals associated with a second cross access dual port bit cell so that one of the cross access ports of the second cross access dual port bit cell is enabled; and
performing a read or write operation on the second cross access dual port bit cell via the enabled cross access port without any read/write operation being performed via the other cross access port of the second cross access dual port bit cell;
wherein the first and the second cross access dual port bit cells share the same row in the dual port memory array.

16. The method of claim 14, further comprising:
forming the cross access ports of each of the plurality of cross access dual port bit cells on a layer separate from other components of the cross access dual port bit cell formed on a different layer.

17. The method of claim 14, further comprising:
connecting the pair of cross access ports to the other components of the cross access dual port bit cell formed on the different layer via one or more inter-layer vias to form a three dimensional (3D) structure.

18. The method of claim 14, wherein:
each of the pair of row selection signals is positive enabled to select one of the cross access ports of the cross access dual port bit cells in the row when the row selection signal is logically high.

19. The method of claim 14, wherein:
each of the pair of column selection signals is negative enabled to select one of the cross access ports of the cross access dual port bit cells in the column when the column selection signal is logically low, wherein one of the pair of column selection signals is logically low at any time during the write operation.

* * * * *